United States Patent
Honma et al.

(10) Patent No.: US 8,159,882 B2
(45) Date of Patent: Apr. 17, 2012

(54) NONVOLATILE SEMICONDUCTOR MEMORY DEVICE AND MEMORY SYSTEM

(75) Inventors: Mitsuaki Honma, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 12/672,335

(22) PCT Filed: Sep. 2, 2008

(86) PCT No.: PCT/JP2008/066141
§ 371 (c)(1),
(2), (4) Date: Feb. 5, 2010

(87) PCT Pub. No.: WO2009/031675
PCT Pub. Date: Mar. 12, 2009

(65) Prior Publication Data
US 2011/0205805 A1    Aug. 25, 2011

(30) Foreign Application Priority Data
Sep. 3, 2007  (JP) .................................. 2007-228271

(51) Int. Cl.
*G11C 16/06* (2006.01)
(52) U.S. Cl. ......... 365/185.22; 365/185.09; 365/185.21; 365/185.24; 365/185.12; 365/185.13
(58) Field of Classification Search ............. 365/185.22, 365/185.09, 185.21, 185.24, 185.17, 185.12, 365/185.13
See application file for complete search history.

(56) References Cited

U.S. PATENT DOCUMENTS

| | | | |
|---|---|---|---|
| 6,000,843 A * | 12/1999 | Sawada | 365/201 |
| 6,178,115 B1 | 1/2001 | Shibata et al. | |
| 6,456,528 B1 | 9/2002 | Chen | |
| 2005/0169057 A1 | 8/2005 | Shibata et al. | |
| 2006/0181923 A1 | 8/2006 | Shibata | |
| 2006/0209592 A1 | 9/2006 | Li et al. | |
| 2006/0215450 A1 | 9/2006 | Honma et al. | |
| 2008/0062758 A1 | 3/2008 | Honma et al. | |

* cited by examiner

*Primary Examiner* — Thong Q Le
(74) *Attorney, Agent, or Firm* — Oblon, Spivak, McClelland, Maier & Neustadt, L.L.P.

(57) ABSTRACT

A semiconductor memory device executes a writing operation based on a first bit assignment pattern at the time of writing. The first bit assignment pattern is created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1". The semiconductor memory device operates at the time of reading such that a read voltage corresponding to the transition points of "0" and "1" is applied to the word line on a page basis to determine x-bit data stored in the memory cell one-bit by one-bit based on the first assignment pattern. The page contains a set of data on the same digit bit in pieces of x-bit data stored in the memory cells connected to the word line.

20 Claims, 18 Drawing Sheets

Data Conversion Table Execution Example

| | A | B | C | D | E | F | G | H | |
|---|---|---|---|---|---|---|---|---|---|
| Before Conversion | 1 | 1 | 1 | 0 | 0 | 0 | 0 | 1 | ←Third Page |
| | 1 | 1 | 0 | 0 | 1 | 1 | 0 | 0 | ←Second Page |
| | 1 | 0 | 0 | 0 | 0 | 1 | 1 | 1 | ←First Page |

↓

| | A | B | C | D | E | F | G | H | |
|---|---|---|---|---|---|---|---|---|---|
| After Conversion | 1 | 0 | 0 | 1 | 1 | 0 | 0 | 1 | ←Third Page |
| | 1 | 1 | 0 | 0 | 0 | 0 | 1 | 1 | ←Second Page |
| | 1 | 1 | 1 | 1 | 0 | 0 | 0 | 0 | ←First Page | log(Cell Count)

|  | Flag Bits | |
|---|---|---|
|  | Upper | Lower |
| Non-Written Word Line | 0 | 0 |
| Word Line Written to First Stage | 0 | 1 |
| Word Line Written to Second Stag | 1 | 0 |
| Word Line Written to Third Stage | 1 | 1 |

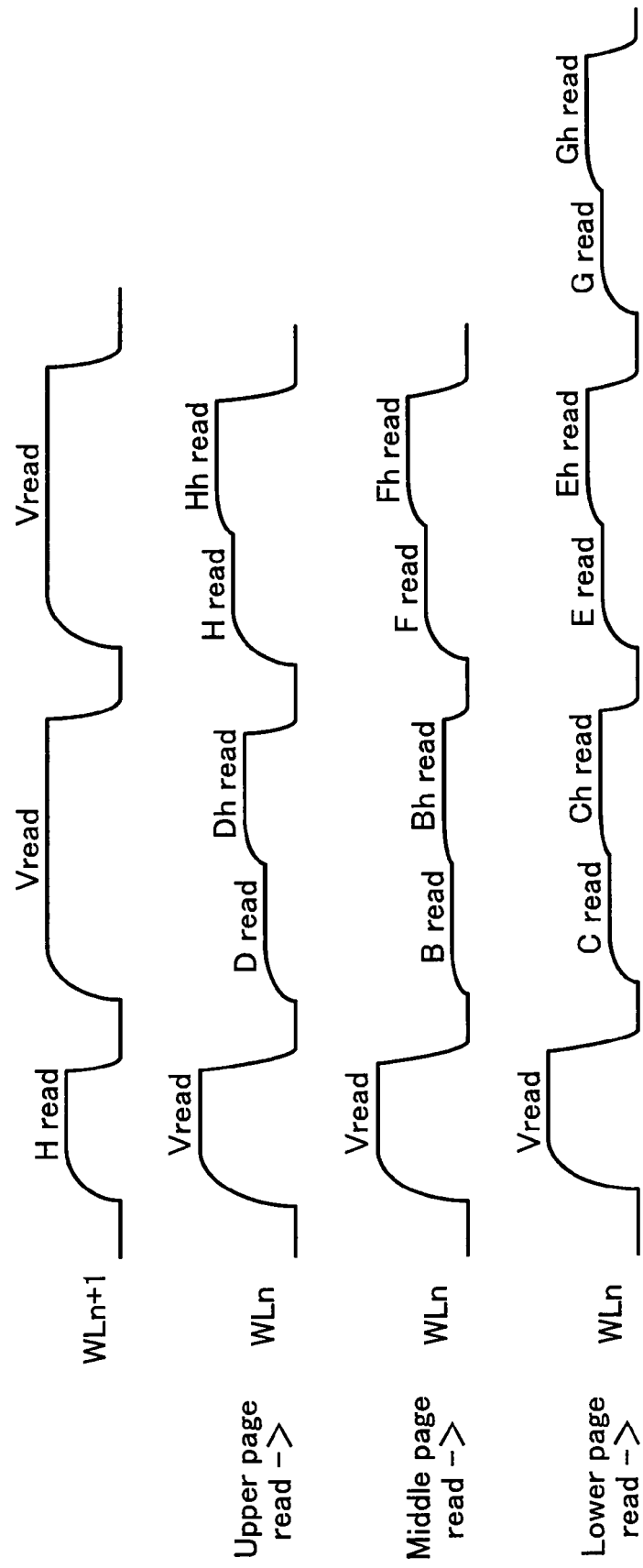

NONVOLATILE SEMICONDUCTOR MEMORY DEVICE AND MEMORY SYSTEM

TECHNICAL FIELD

The present invention relates to a nonvolatile semiconductor memory device capable of storing multi-bit data in a threshold-variable memory cell, and more particular to a nonvolatile semiconductor memory device and memory system capable of keeping the read numbers of page data in balance.

BACKGROUND ART

In recent years, the need for realizing mass storage in nonvolatile semiconductor memory devices of such the type has made multi-valuing technologies standard, which allow one memory cell to have multiple threshold states to store multi-bit information (for example, Patent Document 1: JP 2001-93288A). Multi-valuing reduces the difference between threshold distributions for use in expression of data.

Therefore, due to factors such as failures in memory cells and applications of excessive write voltages, the threshold of a memory cell may be written erroneously in a different position from a desired position, thereby easily causing failed read.

In particular, failed read may often arise between adjacent threshold distributions. In order to correct the failed read to proper information, an external error correction circuit is introduced (for example, Patent Document 2: JP 2002-251884A). When a prior art method is used in bit assignment, however, the read number greatly differs between pages and according the error rate differs from page to page. Therefore, the error correction may not be executed with efficiency possibly.

In multi-valuing of the memory cell, a prior art read procedure (binary search reading method) causes such that the more the memory cell is multi-valued, the larger the total of read time becomes because the read time differs from each multi-bit page to other (Patent Document 1). Namely, a NAND flash memory requires time for providing data to external, other than reading operations. When the data output operation and the reading operation to the next page are executed in parallel and if the read time differs from page to page, the most read time-consuming page determines the read time because the data output time is constant. Therefore, it is required to balance the read time on pages.

DISCLOSURE OF INVENTION

In an aspect the present invention provides a memory system, comprising: a nonvolatile semiconductor memory device including a memory cell array containing a plurality of memory cells connected to word lines extending in a selection row direction and bit lines extending in a selection column direction, each memory cell having a threshold adjusted to belong to any one of $2^x$ pieces of threshold distributions (x is an integer of 3 or more) to store x-bit data corresponding to the threshold distribution, the memory cells arranged in matrix, a word line control circuit connected to the word lines and operative to apply a write voltage, a write-verify voltage or a read voltage to a word line connected to a data write or read target memory cell, a sense amplifier circuit connected to the bit lines and operative to read data stored in the memory cell and hold the read data and data to be written in the memory cell, and a control circuit operative to generate the write voltage, the write-verify voltage and the read voltage and also generate control signals for control of various parts to control writing and reading data to/from the memory cell; and a controller operative to control reading and writing data from/to the nonvolatile semiconductor memory device, wherein a writing operation and a verifying operation are repeated at the time of writing to write x-bit data in the memory cell, the writing operation including converting input data provided based on a first bit assignment pattern into a second bit assignment pattern, and applying a write voltage to the word line to shift the threshold of the memory cell based on the second bit assignment pattern, the first bit assignment pattern created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1", the second bit assignment pattern having a suppressed shift of the threshold distribution at the time of writing smaller than the first bit assignment pattern, the verifying operation including applying a write-verify voltage to the word line to verify the threshold, wherein a read voltage corresponding to the transition points of "0" and "1" is applied at the time of reading to the word line on a page basis to determine x-bit data stored in the memory cell one-bit by one-bit based on the first assignment pattern, the page containing a set of data on the same digit bit in pieces of x-bit data stored in the memory cells connected to the word line.

In another aspect the present invention provides a nonvolatile semiconductor memory device, comprising: a memory cell array containing a plurality of memory cells connected to word lines extending in a selection row direction and bit lines extending in a selection column direction, each memory cell having a threshold adjusted to belong to any one of $2^x$ pieces of threshold distributions (x is an integer of 3 or more) to store x-bit data corresponding to the threshold distribution, the memory cells arranged in matrix; a word line control circuit connected to the word lines and operative to apply a write voltage, a write-verify voltage or a read voltage to a word line connected to a data write or read target memory cell; a sense amplifier circuit connected to the bit lines and operative to read data stored in the memory cell and hold the read data and data to be written in the memory cell; and a control circuit operative to generate the write voltage, the write-verify voltage and the read voltage and also generate control signals for control of various parts to control writing and reading data to/from the memory cell, wherein the control circuit controls such that a writing operation and a verifying operation are repeated at the time of writing to write x-bit data in the memory cell, the writing operation including applying a write voltage to the word line to shift the threshold of the memory cell based on a first bit assignment pattern, the first bit assignment pattern created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1", the verifying operation including applying a write-verify voltage to the word line to verify the threshold, wherein the control circuit controls such that a read voltage corresponding to the transition points of "0" and "1" is applied at the time of reading to the word line on a page basis to determine x-bit data stored in the memory cell one-bit by one-bit based on the first assignment pattern, the page containing a set of data on the same digit bit in pieces of x-bit data stored in the memory cells connected to the word line.

In another aspect the present invention provides a memory system, comprising: a memory cell array containing first lines, second lines arranged across said first lines, and a plurality of memory cells arranged in matrix along said first and second lines and operative to receive/feed data via said second lines in accordance with a voltage applied to said first lines; a first line control circuit connected to said first lines and operative to apply a write voltage, a write-verify voltage or a read voltage to a first line connected to a data write or read target memory cell; a second line control circuit connected to said second lines and operative to read data stored in said memory cell and hold said read data and data to be written in said memory cell; and a control circuit operative to generate said write voltage, said write-verify voltage and said read voltage and also generate control signals for control of said first and second line control circuits to control writing and reading data to/from said memory cell, wherein said memory cell has a threshold controlled to belong to any one of $2^x$ pieces of threshold distributions (x is an integer of 3 or more) to store x-bit data, wherein said control circuit controls such that a writing operation and a verifying operation are repeated at the time of writing to write x-bit data in said memory cell, said writing operation including applying a write voltage to said first line to shift the threshold of said memory cell based on a second bit assignment pattern having a suppressed shift of a threshold distribution at the time of writing smaller than a first bit assignment pattern, said first bit assignment pattern created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1", said verifying operation including applying a write-verify voltage to said first line to verify said threshold, wherein said control circuit controls such that a read voltage corresponding to said transition points of "0" and "1" is applied at the time of reading to said first line on a page basis to determine x-bit data stored in said memory cell one-bit by one-bit based on said first assignment pattern, said page containing a set of data on the same digit bit in pieces of x-bit data stored in said memory cells connected to the first line.

BRIEF DESCRIPTION OF DRAWINGS

FIG. 16 is a waveform diagram of read voltages in the memory system according to the same embodiment.

EMBODIMENTS

The embodiments of the present invention will now be described with reference to the drawings.

[First Embodiment]

Figure 1:
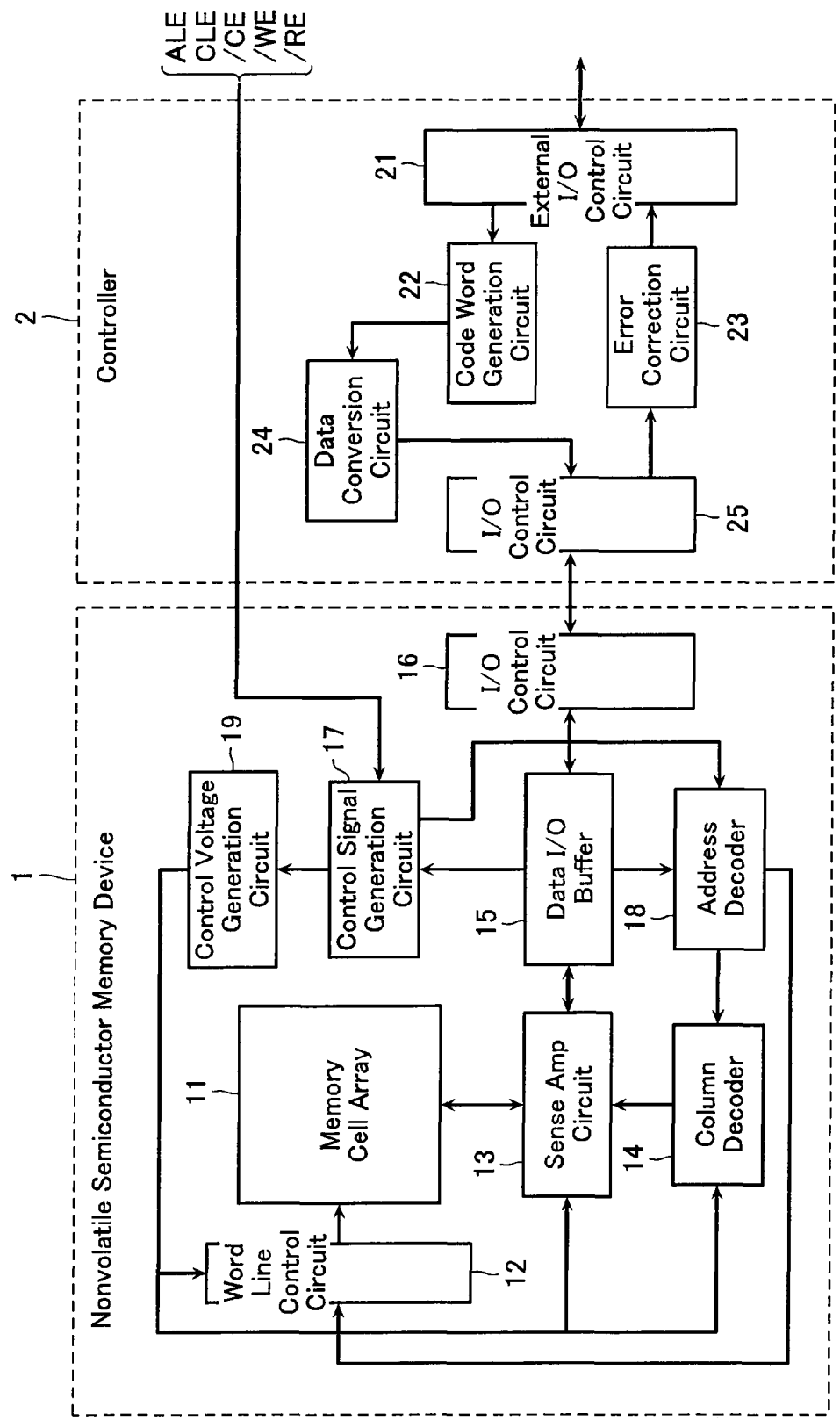
FIG. 1 is a block diagram showing a memory system arrangement according to an embodiment of the present invention.

FIG. 1 is a block diagram showing a memory system according to a first embodiment of the present invention.

The memory system of this embodiment comprises a nonvolatile semiconductor memory device 1 composed of a NAND flash memory, and a controller 2 operative to control associated read/write.

Figure 2:
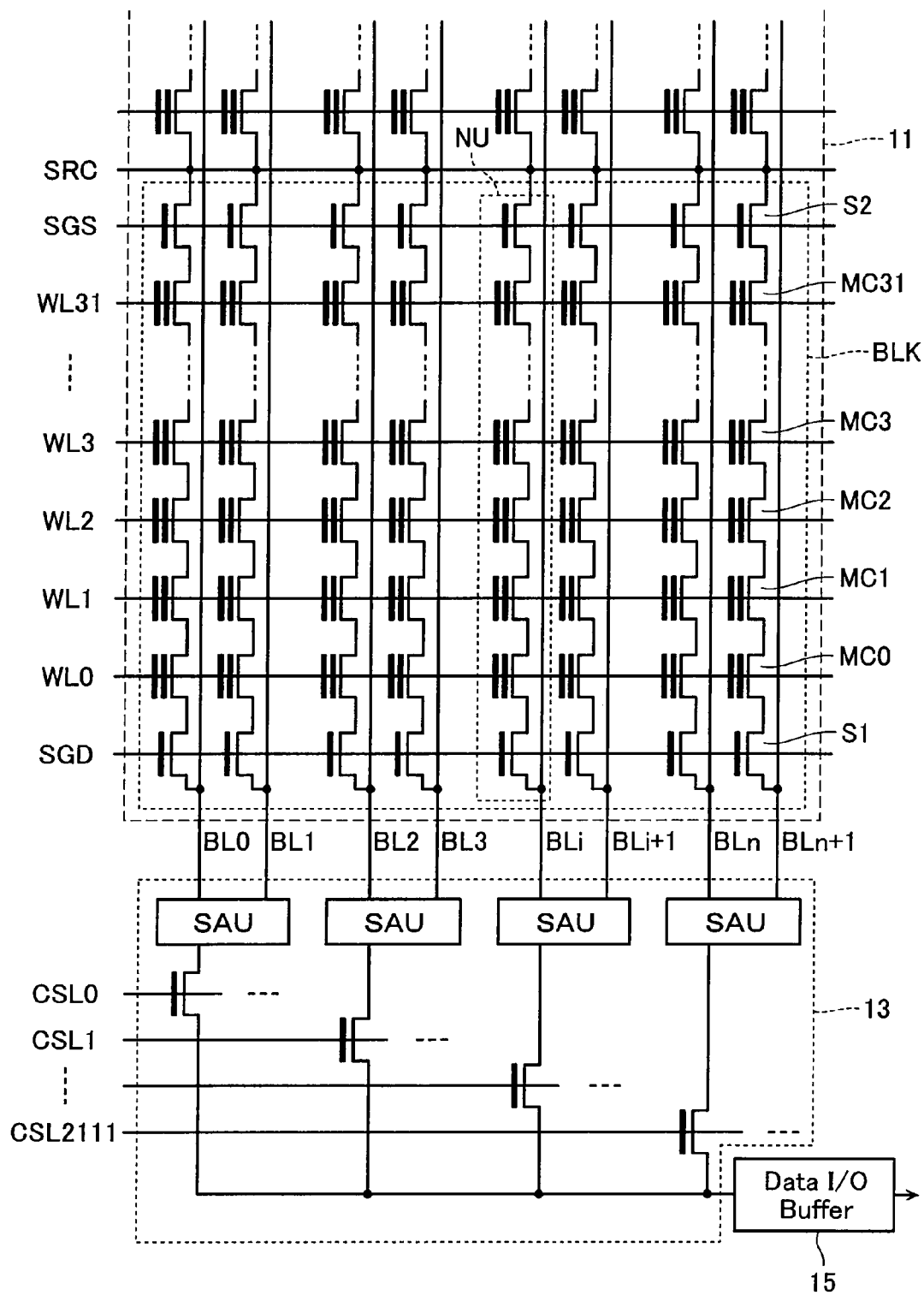
FIG. 2 is a circuit diagram showing a memory cell array arrangement in the same memory system.

The nonvolatile semiconductor memory device 1 includes a memory cell array 11. The memory cell array 11 contains a plurality of electrically erasable programmable nonvolatile memory cells MC arranged in matrix as shown in FIG. 2. Each memory cell MC has such a threshold that is controlled to belong to one of 8 threshold distributions, thereby storing 3-bit (octonary) data. In this example, 32 memory cells MC0-MC31 are connected in series to configure a NAND cell unit (NAND string) NU together with selection gate transistors S1, S2 connected to both ends thereof.

One end of the NAND cell unit NU is connected via the selection gate transistor S1 to bit lines BL0, BL2, ..., BLn (hereinafter given a general name of "even bit line BLe") and bit lines BL1, BL3, ..., BLn+1 (hereinafter given a general name of "odd bit line BLo"), and the other end thereof is connected via the selection gate transistor S2 to a common source line SRC. The memory cells MC0-MC31 have respective control gates, which form word lines WL0-WL31. The selection gate transistors S1, S2 have respective gates, which form selection gate lines SGD, SGS.

A set of NAND cell units arrayed in the word line direction configures a block BLK serving as the minimum unit of data erase. Plural such blocks BLK are arranged in the bit line direction. A set of even memory cells MC and a set of odd memory cells MC arrayed in the word line direction each configure a page serving as the unit of write and read. In addition, pieces of 3-bit data stored in the memory cells MC include sets of bits in the word line direction, which configure a first page, a second page, and a third page from the lower bit to the upper bit.

As shown in FIG. 1, arranged on one end side of the memory cell array 11 in the bit line direction is a sense amplifier circuit 13 that serves the purpose of reading and writing cell data. In addition, arranged on one end side of the memory cell array 11 in the word line direction is a word line control circuit 12 that selectively drives the word lines WL and the selection gate lines SGD, SGS. The word line control circuit 12 includes a row decoder to select and drive the word lines in the memory cell array 11. The sense amplifier circuit 13 is connected to the bit lines in the memory cell array 11 and has a function of reading data and a data latch function of holding read data and write data. A column decoder 14 is connected to the sense amplifier circuit 13 and selects the bit lines in the memory cell array 11.

At the time of data read, read data in the sense amplifier circuit 13 is provided to the controller 2 via a data I/O buffer 15 and an I/O control circuit 16. At the time of data write, write data fed from the controller 2 to the I/O control circuit 16 is loaded in the sense amplifier circuit 13 via the data I/O buffer 15.

A command fed from the I/O control circuit 16 via the data I/O buffer 15 is decoded at a control signal generation circuit 17. The control signal generation circuit 17 is supplied with external control signals such as a chip enable signal /CE, a write enable signal /WE, a read enable signal /RE, an address latch enable signal ALE, and a command latch enable signal CLE. The control signal generation circuit 17 executes sequence control of data write and erase, and control of data read based on external control signals and commands supplied in accordance with operation modes.

An address received via the I/O control circuit 16 is fed to an address decoder 18 via the data I/O buffer 15 and then transferred to the word line control circuit 12 and the column decoder 14.

A control voltage generation circuit 19 is provided to generate various higher voltages than the supply voltage in accordance with operation modes. The control voltage generation circuit 19 is controlled by the control signal generation circuit 17.

On the other hand, the controller 2 is configured as follows. An I/O control circuit 25 controls data communications between the nonvolatile semiconductor memory device 1 and the controller 2. An external I/O control circuit 21 is used to receive write data fed from external and send it to the nonvolatile semiconductor memory device 1. It is also used to receive data read out of the nonvolatile semiconductor memory device 1 and provide it to external. A code word generation circuit 22 generates redundant data for error correction and generates a code word containing external input data and the redundant data added thereto. An error correction circuit 23 executes error correction based on read data (an information part plus a redundant part) if there is a data error in the data read out of the nonvolatile semiconductor memory device 1. A data conversion circuit 24 converts input data, which is based on a first bit assignment pattern for efficient data read of the present invention, into write data, which is based on a second bit assignment pattern suitable for write, as described in detail later.

Figure 3:
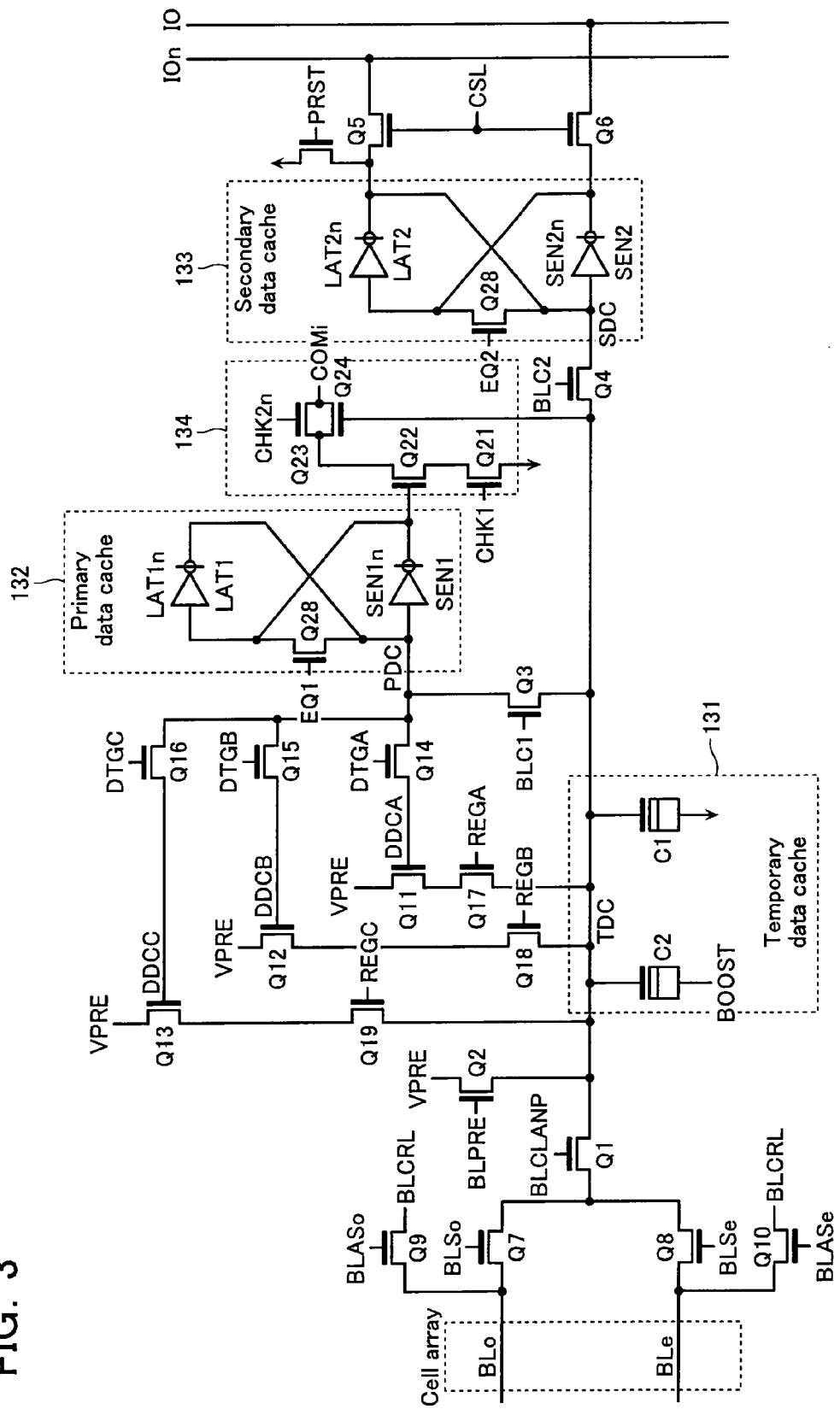
FIG. 3 is a circuit diagram showing a sense amplifier unit in the same memory system.

FIG. 3 shows a specific configuration of a sense amplifier unit SAU in the sense amplifier circuit 13. A node (first node) TDC is a sense node for sensing a bit line voltage as well as a data storage node for temporarily storing data. The node TDC configures a temporary data storage circuit 131 together with a charge holding capacitor C1 and a boosting capacitor C2.

The node TDC is connected to the bit line via a clamping NMOS transistor Q1. In a shared sense amplifier scheme, bit line selection transistors Q7, Q8 are arranged between the clamping NMOS transistor Q1 and the bit lines BLe, BLo such that the clamping NMOS transistor Q1 is connected to one of the bit lines BLe, BLo. The other of the bit lines BLe, BLo is selected by one of shield selection transistors Q9, Q10 and connected to a fixed potential to serve as a shield line.

The clamping NMOS transistor Q1 acts to clamp the bit line voltage at the time of reading and transfer it to the node TDC. The node TDC is connected to a precharging NMOS transistor Q2 for precharging the bit line and the node TDC.

The node TDC is connected to data storage nodes (second and third nodes) PDC, SDC in data latches (first and second latches) 132, 133 via transfer NMOS transistors Q3, Q4, respectively. The data latch 132 is a data storage circuit that holds read data and write data. The data latch 133 is a data cache that is arranged between the data latch 132 and data lines IO, IOn and used for temporarily storing write data or read data.

The node SDC in the data latch 133 is connected to the data lines IO, IOn via selection gate transistors Q5, Q6 driven by a column selection signal CSL.

Data write is executed by repeating write voltage application and write-verify to obtain a certain threshold distribution. Write-verify is executed on a bit-basis and the verified result requires determination of write data in the next cycle.

An NMOS transistor Q11 having a drain given a voltage VPRE has a gate, which serves as a data storage node (fourth node) DDCA for temporarily saving and holding write data held on the node PDC in the data latch 132 at the time of writing. Write data on the node PDC in the data latch 132 is transferred to the data storage node DDCA via a transfer NMOS transistor (third transfer transistor) Q14. The voltage VPRE is selectively set at Vdd or Vss.

The NMOS transistor (first write-back transistor) Q11 and an NMOS transistor (second write-back transistor) Q17 interposed between the former and the data storage node TDC make it possible to set data on the data storage node TDC in accordance with data on the data storage node DDCA. Namely, the NMOS transistors Q11, Q17 configure a write-back circuit for writing write data in the next cycle back to the data storage node TDC at the time of writing.

Multivalue storage of this embodiment requires reference of already written data on lower pages than the current writing page for write-verify control of the current writing page. For octonary storage, writing is executed to three pages including a first page (lower page), a second page (middle page), and a third page (upper page). In this case, writing to the second page requires reference of data on the first page, and writing to the third page requires reference of data on the first and second pages.

In response to such the requirement, the sense amplifier unit SAU further includes two NMOS transistors Q12, Q13 having respective gates provided as data storage nodes DDCB, DDCC in parallel with the data storage nodes DDCA for temporarily holding write data as described above. Transfer NMOS transistors Q15, Q16 are arranged to transfer page data read in the data latch 132 to the data storage nodes DDCB, DDCC. In addition, transfer NMOS transistors Q18, Q19 are interposed between the transistors Q12, Q13 and the node TDC.

In accordance with the data held on the data storage nodes DDCA, DDCB, DDCC, and in accordance with the selection of the drain voltage VPRE of the transistors Q11, Q12, Q13, it is made possible to execute control at the time of verify-read such that the data node TDC can be forcibly discharged (that is, set at "L" level) or charged (that is, set at "H" level).

The data latch 132 is connected to a verify-check circuit 134. An NMOS transistor Q22 having a gate connected to one node in the data latch 132 is a checking transistor. It has a source grounded via an NMOS transistor Q21 controlled by a check signal CHK1, and a drain connected to a common signal line COMi common to sense units in one page via transfer NMOS transistors Q23, Q24 provided in parallel. The NMOS transistors Q23, Q24 have respective gates controlled by a check signal CHK2n and the node TDC.

Only if "0" write is determined insufficient as a result of verify-read, write-back is executed such that the node PDC in the data latch 132 becomes "L" (="0"). After completion of one page write, verify-control is executed such that the data latches 132 become all "1".

At the time of data write, the verify-check circuit 134 turns on after verify-read in the sense units in one page. Unless write is completed in some sense units, the verify-check circuit 134 discharges the common signal line COMi that has been precharged to "H". Once the data latches 132 in one page become all "1", the common signal line COMi is not discharged and holds "H", which becomes a pass flag indicative of completion of write.

The following description is given to operation of multi-value data storage of the present embodiment thus configured.

Figure 4:
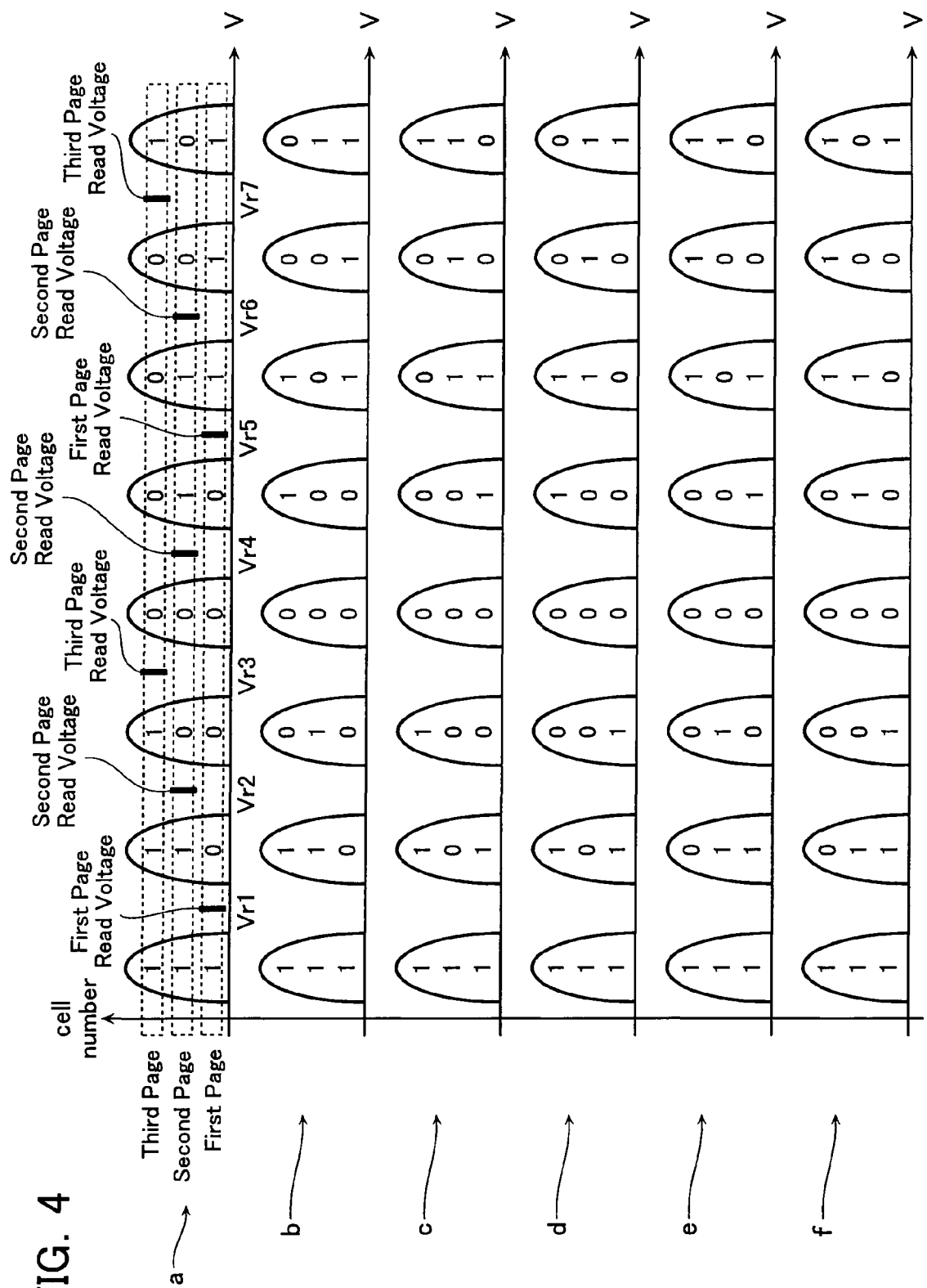
FIG. 4 provides a diagram showing threshold distributions on octonary storage and bit assignment patterns in the threshold distributions.

FIG. 4 provides a diagram showing 8 threshold distributions and associated bit assignment patterns for 3-bit (octonary) data storage for use in the present embodiment. The bit assignment patterns satisfy the following two conditions.

(1) Pieces of 3-bit data assigned to adjacent threshold distributions have only a 1-bit difference therebetween.

(2) Alignments of data on a first page through a third page corresponding to an alignment of 8 ($2^3$) pieces of threshold distributions each contain at least two transition points of "0" and "1".

The above condition (1) insures that error bits always include only one bit difference even if writing results in memory cells having threshold distributions that have been written in mountains shifted one by one. This is also a condition for enabling 3-bit data to be determined through 7 times of reading or the minimum times.

On the other hand, the condition (2) is a condition for bringing the read numbers on pages in balance to even bit error rates over pages and improve the reading speed.

Figures 5, 6:
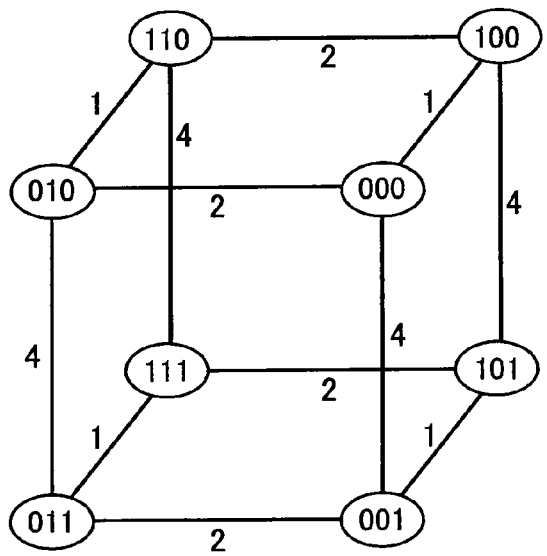
FIG. 5 is a graphic diagram for seeking the bit assignment patterns.
FIG. 6 provides a diagram showing a table for use in conversion from a first bit assignment pattern to a second bit assignment pattern.

In an octonary example, bit assignment patterns that can satisfy the above conditions (1), (2) are 6 ways "a"-"f" in FIG. 4. These patterns "a"-"f" include three patterns shown by [10000111], [11001100] and [11100001] from a lower threshold, which are arbitrarily assigned to a first page through a third page. FIG. 5 shows a graph of 8 nodes expressed by 3 bits, in which those having a distance of "1" are linked with each other. Combinations of patterns starting from the node of data "111" and passing all nodes with one stroke in the graph can provide patterns that satisfies the condition (1). Among those, combinations that satisfy the condition (2) are selected as above-described 6 ways. The condition (2) can be satisfied through selection such that a read number in each page comprises a combination of [2,2,3].

In the present embodiment, the first bit assignment pattern is used only at the time of read. At the time of write, the code word generation circuit 22 generates redundant data and then data based on the first bit assignment pattern is converted at the data conversion circuit 24 in the controller 2 into the second bit assignment pattern suitable for write. Therefore, the data conversion circuit 24 requires a register capable of storing 3-page data. FIG. 6 shows an example of a data conversion table used in the conversion circuit 24. The first bit assignment pattern denoted with "a" in FIG. 4 is converted into the second bit assignment pattern.

Figure 7:
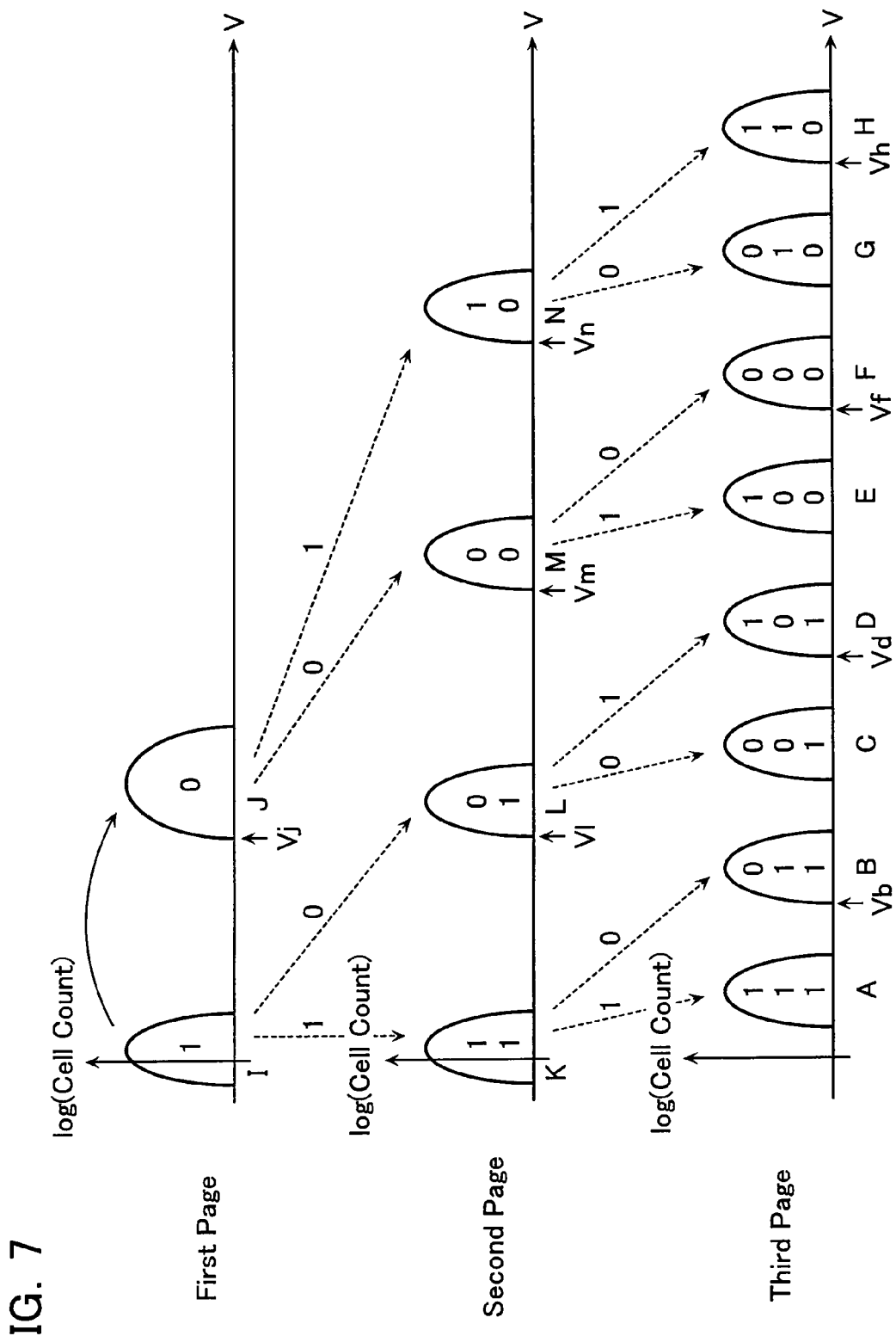
FIG. 7 provides a diagram for illustrating data write processing based on the second bit assignment pattern.

FIG. 7 provides a diagram showing data write based on the second bit assignment pattern after conversion and variations in threshold distribution.

As shown, the second bit assignment pattern is represented by 8 levels from the lowermost threshold level A (a level closest to the erased state) to the uppermost threshold level H, to which pieces of 3-bit data are assigned. Data write is executed sequentially from the first page through the second page to the third page.

In the first page write, write data "0", "1" is given to a cell at a level I in the erased state. In the case of write data "0", the threshold voltage is elevated up to a level J. In the case of write data "1", the current condition is maintained. The level J of write data "0" is determined by the verify voltage Vj set to the lower limit in the distribution. Thus, "0", "1" is written in the first page.

The second page write includes selective "0" write to a cell in an erased state K (write to the level L) and selective "0" write to the level J (write to a level M) and "1" write (write to a level N). It should be noted herein that "0" data is not always such write data that fluctuates the threshold and that "1" data is not always non-write data in the present embodiment. As is in this example, write may be executed to greatly shift the threshold if data is "1". The three types of the second page write are executed under the conditions with simultaneous write voltage application and different write-verify. Namely, write-verify to confirm the levels L, M, N is executed using verify voltages Vl, Vm, Vn at different timings.

The third page write includes selective "0" write to cells at the levels K, M (write to levels B, F) and selective "1" write to cells at the levels L, N (write to levels D, H). The four types of the third page write are executed under the conditions with simultaneous write voltage application and different write-verify. Namely, write-verify is executed using verify voltages Vb, Vd, Vf, Vh.

The write can suppress threshold shifts in write stages and accordingly has an advantage because of less influence exerted to adjacent memory cells (Yupin effect).

Specifically, such the write can be realized through the following operation. Subsequent to command entry and address entry, write data is loaded in the data latch 132 in the sense unit SAU. The write data in the sense unit SAU is transferred to the data storage node DDCA and held thereon for verify-control. Subsequently, the channel potential in the selected cell is controlled based on the write data held in the data latch 132, and a write voltage is applied to the selection word line for writing.

After application of the write voltage, the verify voltage Vj is used in write-verify. On verify-read, in a "0"-write target cell the data node TDC becomes "H" level. In the case of a "1"-write (write inhibit) cell, and in the case of insufficient "0"-write, the data node TDC becomes "L". In contrast, writing the data on the data node DDCA back to the data node TDC, the data node TDC linked to the "1"-write cell is charged up to "H". Accordingly, the data node TDC can be set to "L" level only in the case of insufficient "0"-write. Namely, "1", "0"-write data is held as "H", "L" data on the data node DDCA. When the drain voltage on the transistor Q11 is VPRE=Vdd and the transistor Q17 is turned on for write-back, then TDC="H" in the case of "1"-write and sufficient "0"-write, and TDC="L" in the case of only insufficient "0"-write. The state of the data node TDC is transferred to the data latch 132 as write data in the next write cycle. The write data is transferred again to the data storage node DDCA and held thereon for writing. The step of deciding whether the write is completed is a step of detecting whether the data latches 132 in one page become all "1". If NO, then write voltage application and write-verify are repeated. After completion of the entire one page write, the verify-check circuit 134 detects the all-"1" state in one page and terminates the write sequence.

Also in the second page write, write data is first loaded in the data latch 132 and the write data is then transferred from the data latch 132 to the data storage node DDCA and held thereon. The second page write requires reference of the first page data already written and uses a different write condition. Therefore, the first page data already written is read out of the cell array into the data latch 132 by internal data loading. The first page data thus read out may be inverted and transferred to the data storage node DDCB and held thereon. The second page data held on the data storage node DDCA and the first page data held on the data storage node DDCB are subjected to AND operation and, in accordance with the result, the second page write is executed.

Write-verify requires a first through a third verify step using the verify-voltages Vl, Vm, Vn. The first verify step is to confirm that the first page data is "1", and "0" is written to the level L. As the first verify step uses the verify-voltage Vl, data to be confirmed in the second and third steps using the verify-voltages Vm, Vn must be excluded from the verify-target. Therefore, the first page data held on the data storage node DDCB is used. The operation of excluding the data to be confirmed in the second and third steps from the verify-target is specifically executed as the following operation. Namely, the first page data held on the data storage node DDCB is used to forcibly discharge the data node TDC after verify-read to "L" level (that is, "1" data). The operation of forcibly discharging the data node TDC is executed by holding "0", "1" data on the data storage node DDCB, setting the drain voltage on the transistor Q12 to VPRE=Vss, and turning on the transistor Q18.

The second and the third verify can be executed similarly. Then, a decision is made on completion of write to decide whether the data latches 132 in one page become all "1". The above write and write-verify are repeated until completion of write is determined.

The third page write requires reference of the first and second pages already written and uses a different write condition. Therefore, after the third page write data is loaded, the second and the first page date already written, are sequentially read out of the cell by internal data loading. The third write data is transferred to the data storage node DDCA and held thereon. The second and first page data is transferred to the data storage nodes DDCB and DDCC and held thereon, respectively. Next, in accordance with the write data held on the data storage node DDCA, the cell channel potential is controlled and the write voltage is applied.

Write-verify requires 4 steps that use the verify-voltages Vb, Vd, Vf and Vh in accordance with the states of the first and the second page data.

Once the octonary data is thus written, read is executed in accordance with the first bit assignment pattern as denoted with "a" in FIG. 4 at the time of read. Read is executed sequentially, for example, from the third page through the second page to the first page.

The third page data is read out through 2 times of read using a read voltage Vr3 set between the third and the fourth threshold distribution from the left, and a read voltage Vr7 set between the seventh and the eighth threshold distribution. More specifically, the data is decided as "1" if it is read out of a memory cell that turns on when the read voltage Vr3 is given. The data is decided as "0" if it is read out of a memory cell that turns off when the read voltage Vr3 is given and turns on when the read voltage Vr7 is given. The data is decided as "1" if it is read out of a memory cell that turns off when the read voltage Vr7 is given.

Similarly, the second page data is read out through 3 times of read using a read voltage Vr2 set between the second and the third threshold distribution from the left, a read voltage Vr4 set between the fourth and the fifth threshold distribution, and a read voltage Vr6 set between the sixth and the seventh threshold distribution.

The first page data is read out through 2 times of read using a read voltage Vr1 set between the first and the second threshold distribution from the left, and a read voltage Vr5 set between the fifth and the sixth threshold distribution.

Thus, the read numbers in pages are balanced as 2 times, 3 times, 2 times. Therefore, the error rates in pages can be balanced. When data read is executed in each page in parallel with providing read-out data to outside, the entire read time is increased if the read number in a specific page is extremely large. In such the case, the read time can be reduced if the read numbers in pages are balanced.

The data read out to outside through such the read operation is subjected to error correction at the error correction circuit 23 in the controller 2 and provided to external.

In the present embodiment, redundant data for error correction is created from the data based on the first bit assignment pattern, which is then converted into the second bit assignment pattern. At the time of read, read is executed based on the first bit assignment pattern. Therefore, at the time of write, write can be executed through such a writing method that exerts less influence to adjacent memory cell, and at the time of read, the balanced read numbers in pages enable fast reading with less read error.

The error correction is executed using redundant data created for the data before conversion and accordingly error correction can be performed without any trouble.

[Second Embodiment]

Figure 8:
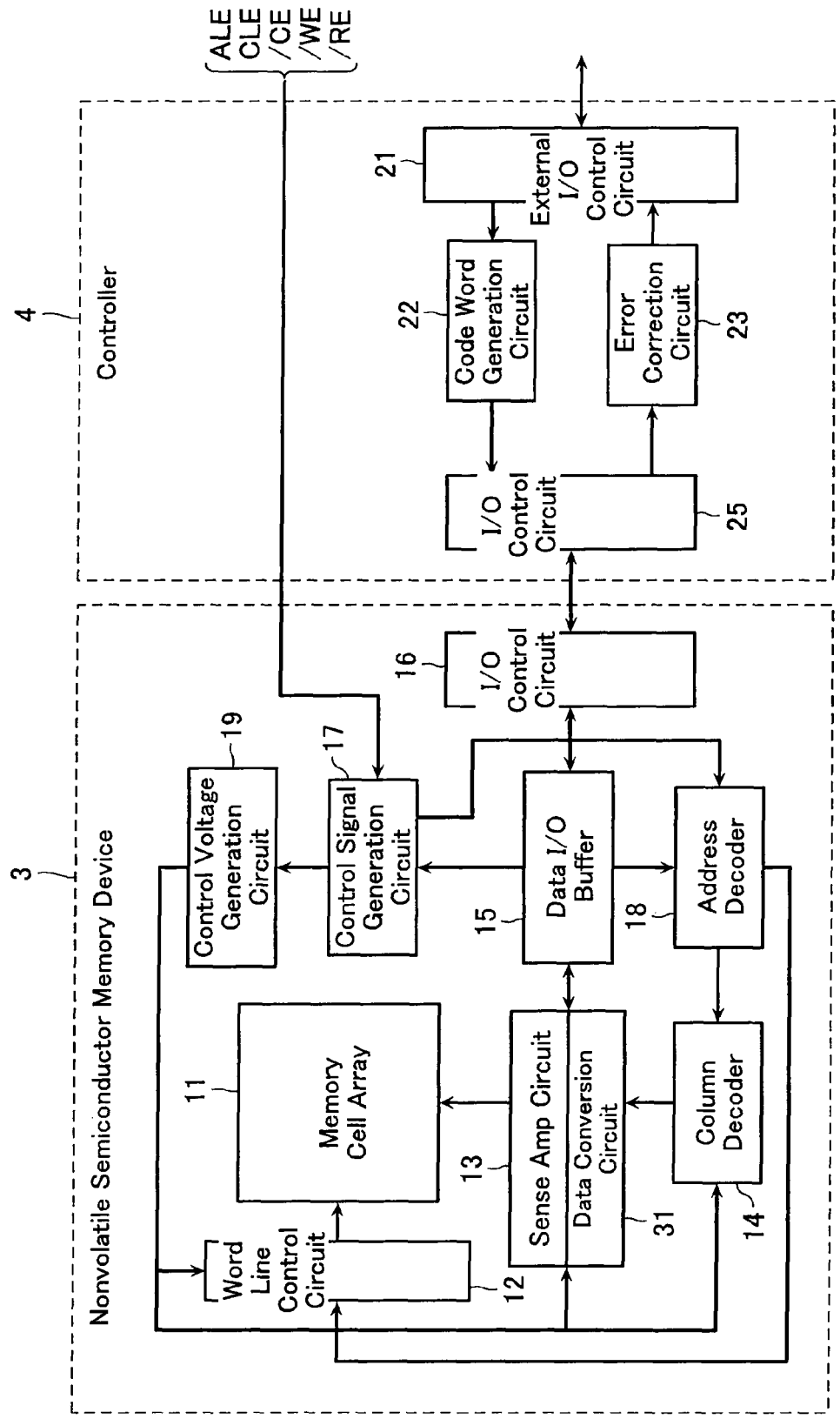
FIG. 8 is a block diagram showing a memory system arrangement according to a second embodiment of the present invention.

In the above embodiment, the data conversion circuit 24 is provided in the controller 2 outside the nonvolatile semiconductor memory device 1. On the contrary, in a second embodiment shown in FIG. 8, a data conversion circuit 31 is provided not in a controller 4 but in a nonvolatile semiconductor memory device 3. The data conversion circuit 31 is arranged between the sense amplifier 13 and the data output buffer 15. With such the configuration, the memory device 3 can exert the above effect as internal processing without regarding the external controller 4.

[Third Embodiment]

In the above embodiments, write data is converted from the first bit assignment pattern to the second bit assignment pattern, followed by writing. In this case, the data conversion circuits 24, 31 are required to store 3-page data therein at a time. Therefore, when it is required to store only 1 page or 2 pages of 3 pages, the remaining data must be fed as dummy data.

The following description is given to a writing method for writing data without causing any variation in bit assignment. This case is not required to provide the data conversion circuits 24, 31.

FIGS. 9A-F show variations in threshold distribution in memory cells on writing data with the read numbers averaged using no data conversion table. Write stages on the first, the second and the third page are referred to as a first, a second and a third stage.

Figures 10, 11:
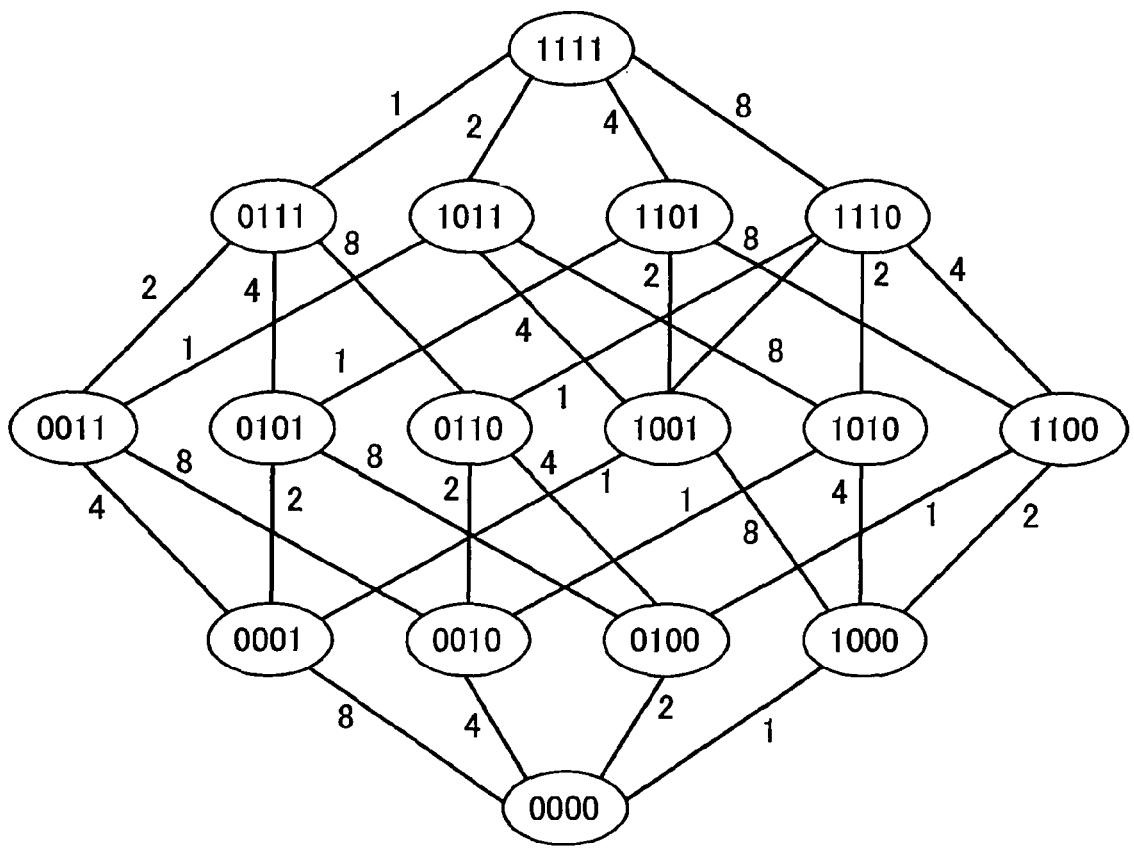
FIG. 10 provides a diagram showing flag bits used in the memory system according to the same embodiment.
FIG. 11 is a graph for seeking hexadecimal bit assignment patterns in a memory system according to a fourth embodiment of the present invention.

FIG. 10 shows an example of assignments of write flag bits for use in realization of the writing method of the present embodiment. The write flag bits exist at each read target word line, indicate 2-bit binary data determinable by an initial application of the read voltage, and express which stage is currently finished to write. For example, when the second stage is finished, the flag bits indicate "10". The flag bits are used to identify which stage is lastly finished to write, thereby controlling the read voltage on the same page lower or higher, and controlling the number of the read voltage applications. The flag bits are written in a management information storage area adjacent to a data storage area in the memory cell array 11.

FIGS. 9A-F provide diagrams for illustrating direct write of bit assignment patterns that correspond to "a"-"f" in FIG. 4. A diagram of the final stage after completion of 3-bit data assignment is shown in the uppermost part in each assignment example. An example is described with reference to FIG. 9A, write is executed based on 1-bit information at the first stage. If write-intended information is "1", then the initial distribution is maintained. In a word, a channel is established in a memory cell even if a program voltage is applied to the gate of the memory cell such the electrons are hardly trapped in the floating gate, thereby suppressing write. In contrast, if write-intended information is "0", then the threshold voltage of data is set slightly higher. In a word, a program voltage is applied to the gate of a memory cell to trap electrons in the floating gate, thereby bringing the memory cell into a state such that it hardly turns on. When this operation completes the first page write, a threshold distribution is obtained as shown in a diagram at the second stage of FIG. 9A. Bit information located in the middle of the distribution is assumed as a bit assignment corresponding to the distribution. On application of a read voltage corresponding to the vertical bar in the diagram at the second stage in the assignment example, the memory cell turns on and discharges the voltage on the bit line because the distribution of data "1" is lower than the read voltage. In contrast, a memory cell of data "0" has a threshold voltage higher than the read voltage and accordingly can not turn on. Identifying the memory cell that can turn on and the memory cell that can not turn on in this way allows the written data to be specified.

After completion of the first stage write, the write flag information is updated from "00" to "01", which enables the termination of the first stage write to be identified. In the second stage write, write is executed from 2 distributions to 4 distributions based on the first stage bit information. For example, in the assignment example of FIG. 9A, data "11", "10" "00" hardly vary from data "1" and data "0" while data "01" moves from data "1" to a higher threshold voltage. It is remarkable herein that data "1" does not always indicate a non-write cell and that data "0" does not always indicate a write cell, also in the present embodiment. For example, in the assignment example of FIG. 9C, the transition of data from "0" to "10" at the second stage corresponds to the case where data "1" is used as write data. Usually, to determine the elevation of the threshold voltage single-mindedly, either transition of "0" or "1" is fixed in the written state. In the present embodiment, though, the data assigning method for writing includes the presence of one or more portions in which the method can not be realized. Therefore, depending on the case, it is required to use the data written at the previous stage and the next write-intended data to be formed, thereby forming write data internally. For example, in the assignment examples of FIG. 9C, if the previously written data is "0" and the next write-intended data is "0", then the non-written state is established. In contrast, if the next write-intended data is "1", the written state is made. This writing method can be realized through NOR operation of the previously written data and the next write data. After completion of the second stage write, the write flag is updated to "10".

Finally, in the third stage, based on write-intended bit information together with the information on the preceding first and second stages, write-up is made from 4 threshold distributions to 8 threshold distributions. After completion of write, the write flag is updated to "11". Through such the procedure, write is executed to a memory cell capable of holding 3-bit information with the balanced read numbers in pages.

[Fourth Embodiment]

The above description is given to octonary data though the present invention is also applicable to multivalue data more than 8 values. FIG. 11 shows a graph for determining hexadecimal bit assignment patterns. This graph shows a graph of 16 nodes expressed by 4 bits, in which those having a distance of "1" are linked with each other. Combinations of patterns starting from the node of data "1111" and passing all nodes with one stroke in the graph can provide patterns that satisfies the above-described condition (1). Among those, combinations that satisfy the condition (2) may be selected. The condition (2) can be satisfied through selection such that a read number in each page comprises a combination of any one of [2,2,3,8], [2,2,4,7], [2,2,5,6], [2,3,3,7], [2,3,4,6], [2,3,5,5], [2,4,4,5], [3,4,4,4] and [3,3,4,5]. The combinations of [3,4,4,4,] are most preferable from the viewpoint of uniformity and present in 24 ways in total. These patterns include patterns shown by [1001100000011111], [1100000011111001], [1111000110000011], and [1111110000110000] from a lower threshold, which are arbitrarily assigned to a first page through a fourth page.

[Fifth Embodiment]

Figure 9A:
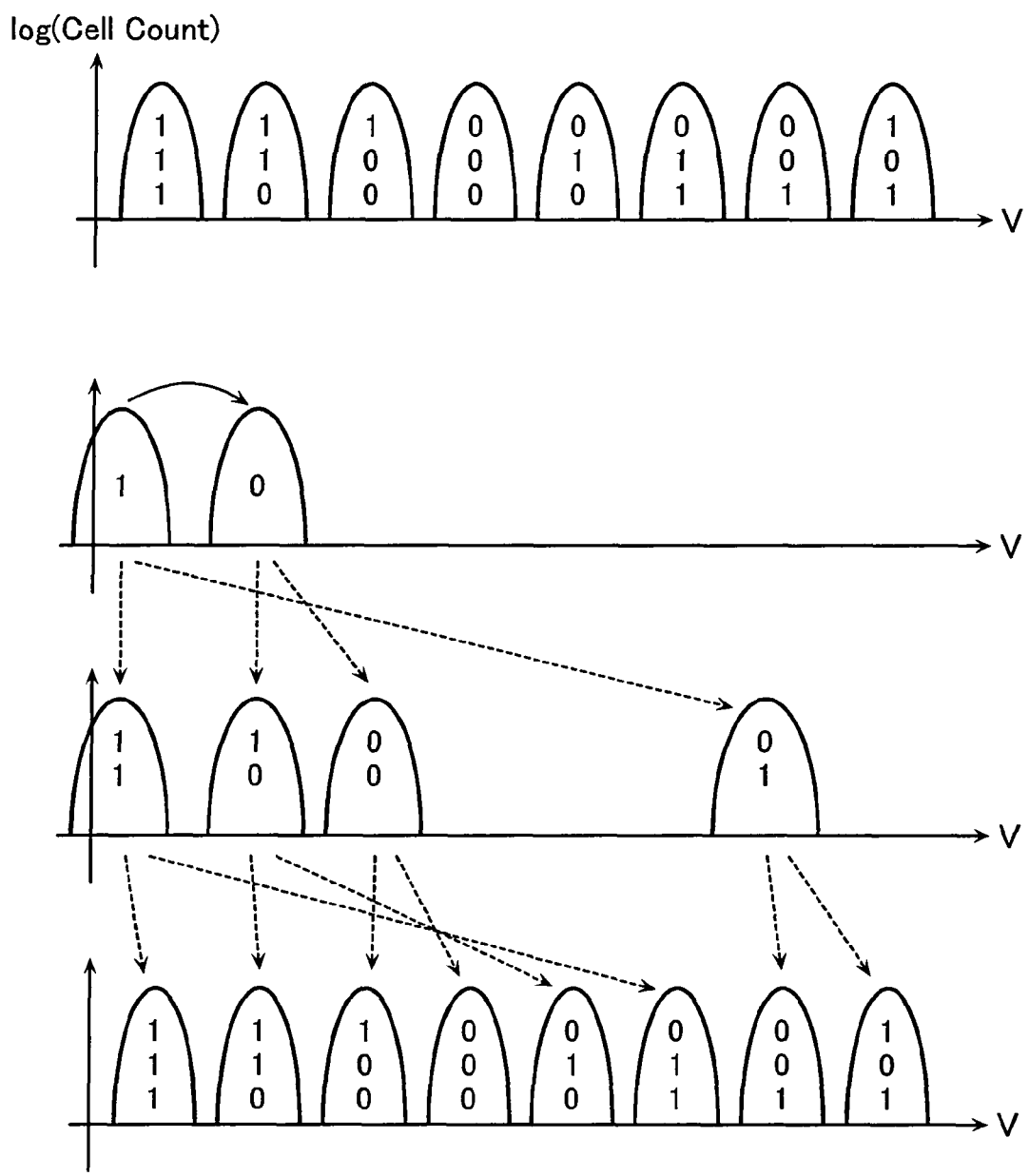
FIG. 9A provides a diagram for illustrating an example of bit assignment patterns in a memory system arrangement according to a third embodiment of the present invention and an associated writing method.
Figure 9B:
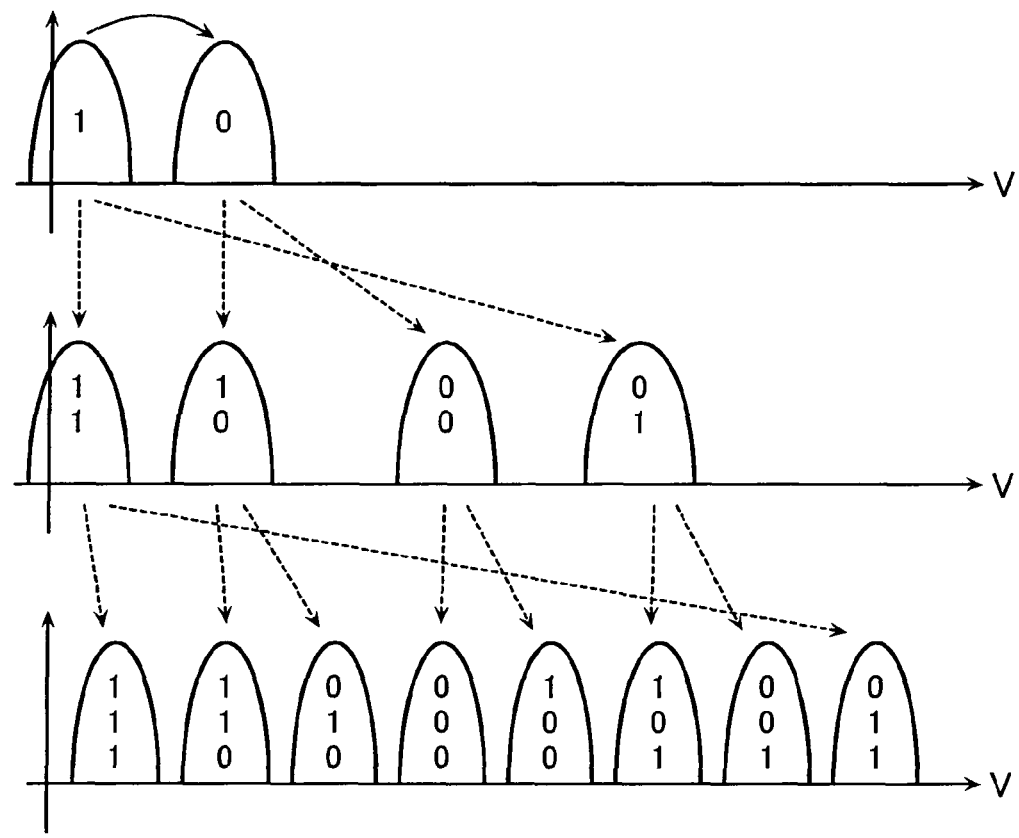
FIG. 9B provides a diagram for illustrating another example of bit assignment patterns in the memory system arrangement according to the third embodiment of the present invention and an associated writing method.
Figure 9C:
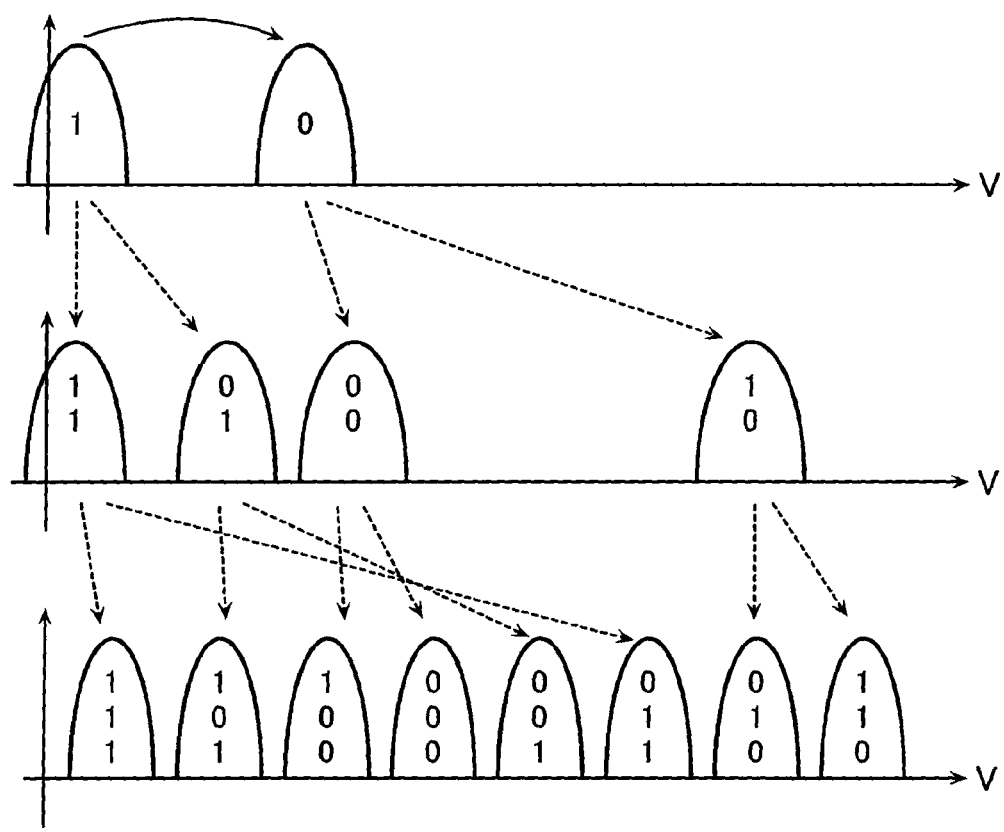
FIG. 9C provides a diagram for illustrating another example of bit assignment patterns in the memory system arrangement according to the third embodiment of the present invention and an associated writing method.
Figure 9D:
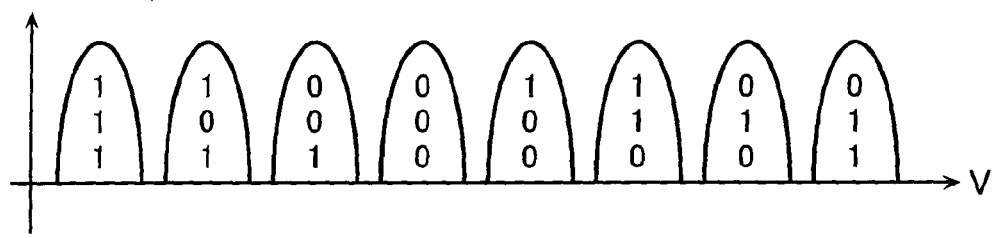
FIG. 9D provides a diagram for illustrating another example of bit assignment patterns in the memory system arrangement according to the third embodiment of the present invention and an associated writing method.
Figure 9D:
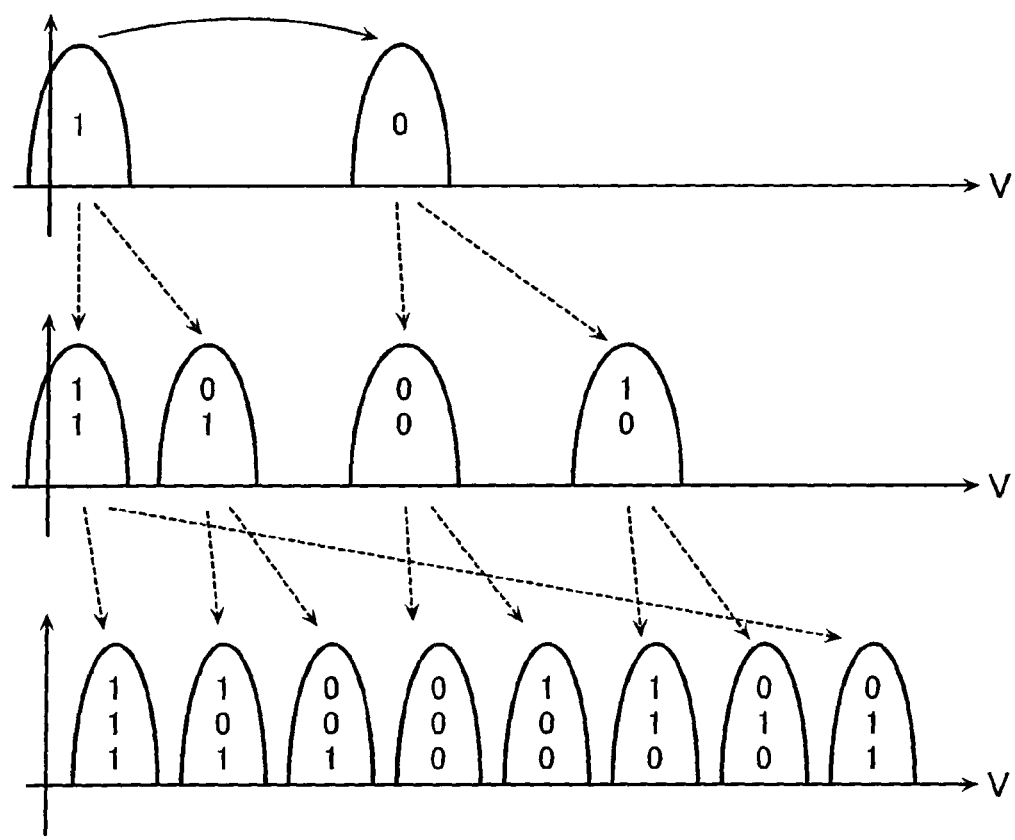
Figure 9E:
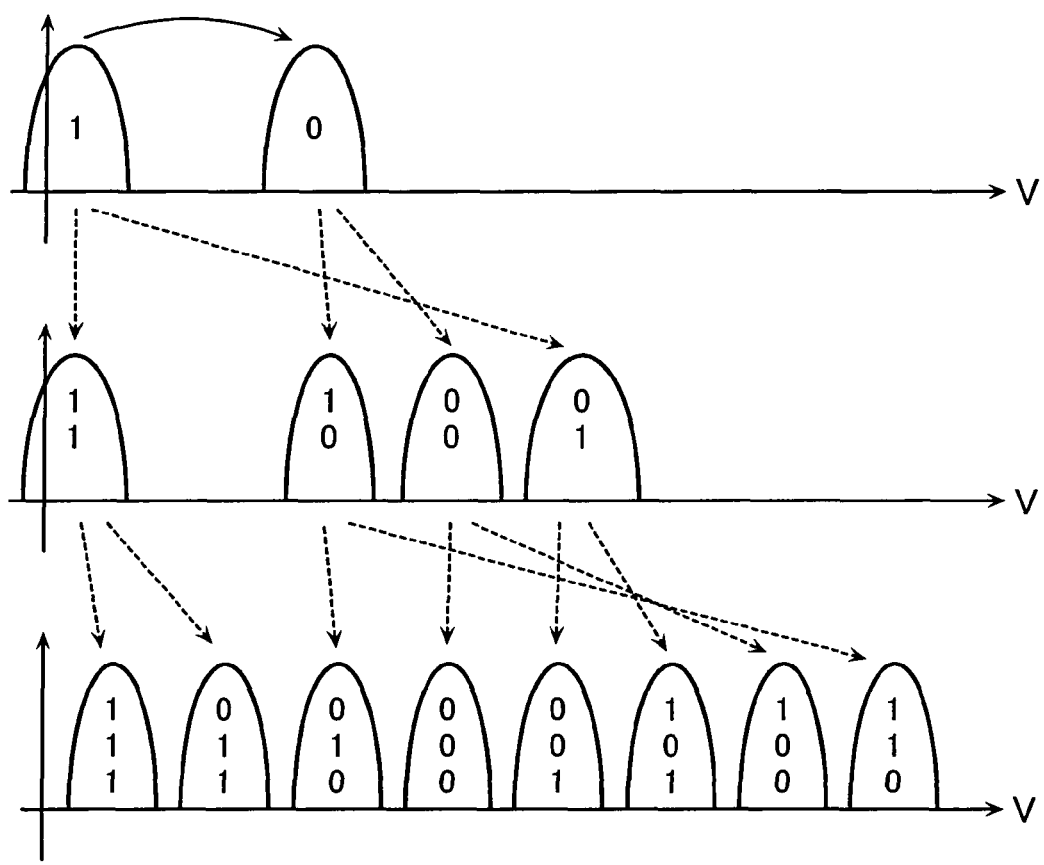
FIG. 9E provides a diagram for illustrating another example of bit assignment patterns in the memory system arrangement according to the third embodiment of the present invention and an associated writing method.
Figure 9F:
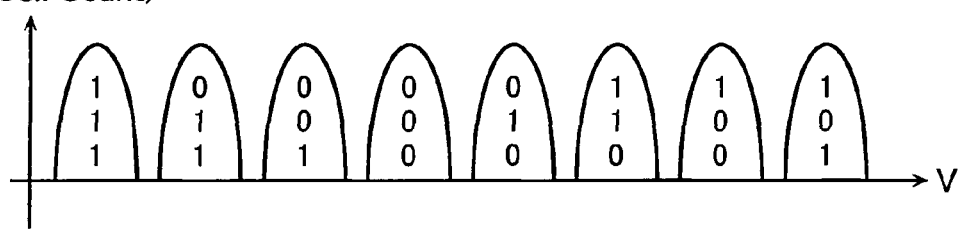
FIG. 9F provides a diagram for illustrating another example of bit assignment patterns in the memory system arrangement according to the third embodiment of the present invention and an associated writing method.
Figure 9F:
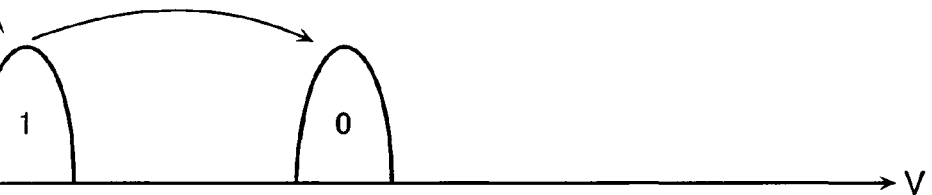
Figure 9F:
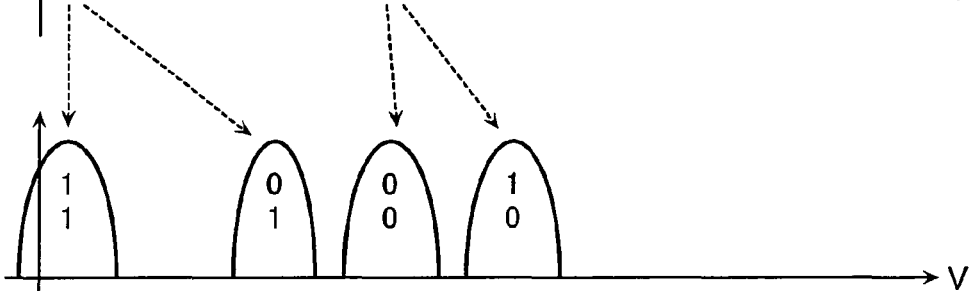
Figure 9F:
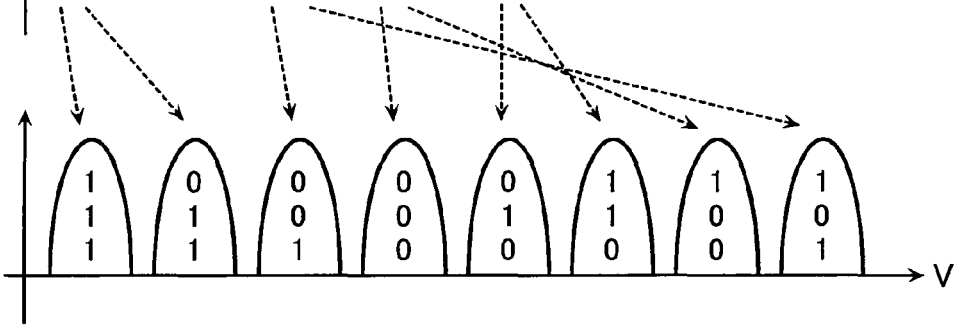

The third embodiment may require such write that greatly varies the threshold distribution of the memory cell, for example, as the write from "1" to "01" in FIG. 9A. In this case, the Yupin effect may vary the thresholds of adjacent memory cells as can be considered. Therefore, the present embodiment compensates for the Yupin effect.

Figure 12:
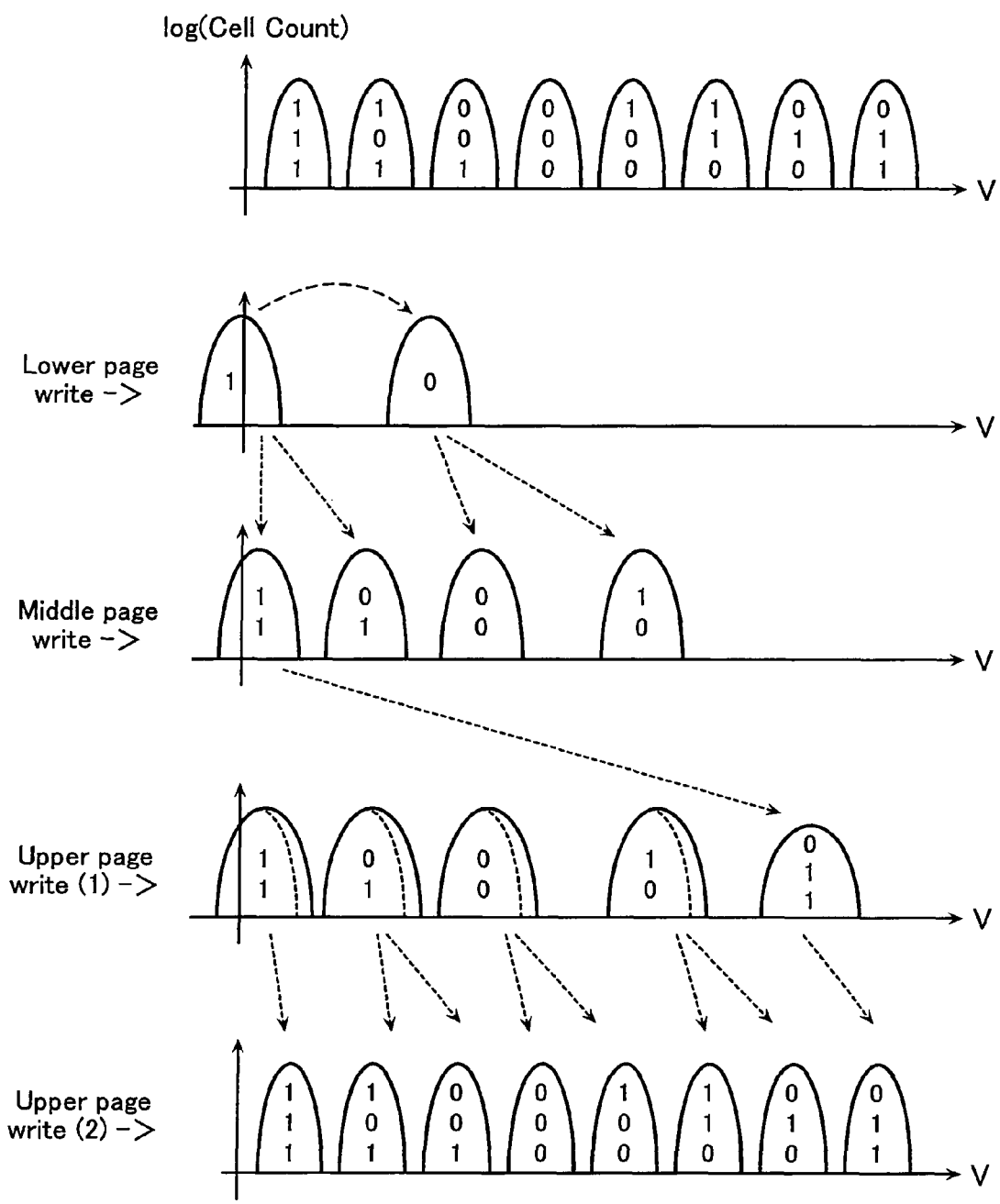
FIG. 12 provides a diagram for illustrating an example of bit assignment patterns in a memory system according to a fifth embodiment of the present invention and an associated writing method.

A method of compensating memory cells adjoining in the column direction (word line direction) for the Yupin effect is described first. FIG. 12 shows variations in threshold distribution caused by the writing method of the present embodiment, which corresponds to the writing method of FIG. 9D. This writing method is characterized in that the threshold distribution must be greatly varied on writing from data "11" to data "011". In this embodiment, when the third page (upper page) is written at the third stage, the third stage is divided into two sub-stages for writing. In the first sub-stage, only rough write is executed to shift the threshold distribution most from "11" to "011". At this sub-stage, the thresholds of adjacent memory cells slightly move as shown with the dotted line in the figure. In the second sub-stage, however, all threshold distributions are shifted accurately, thereby clearing the influence from the Yupin effect.

Figure 13:
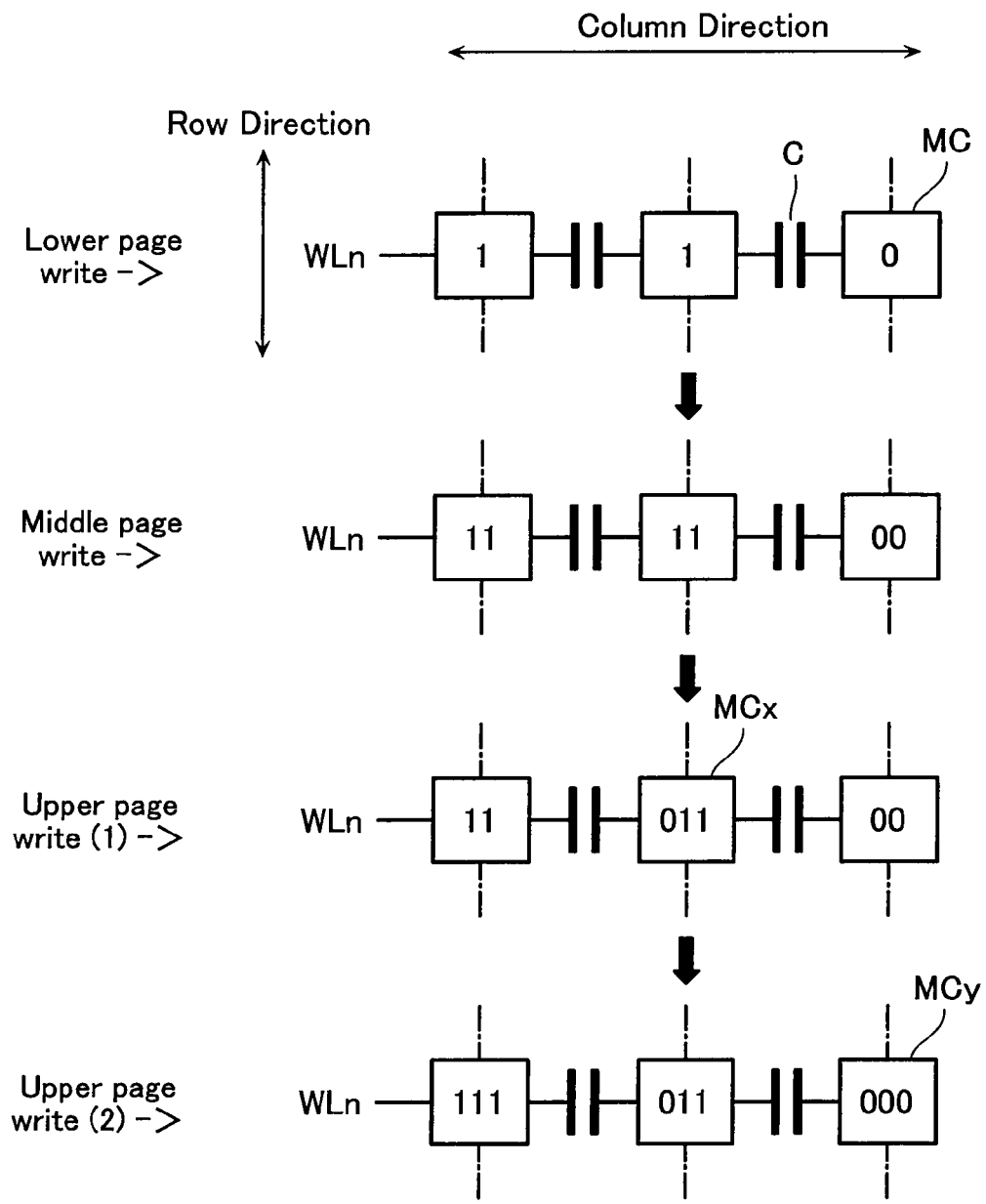
FIG. 13 provides a diagram showing a memory cell arrangement in the memory system according to the same embodiment and variations in write data during the write process.

FIG. 13 shows a relation between memory cells adjoining in the column direction and write data. As shown in FIG. 13, an inter-adjacent-cell capacity C is present between memory cells MC adjoining in the column direction. In memory cells linked to a word line WLn, data in the first page (lower page) of "1", "1", "0" is written, and then data in the second page (middle page) of "11", "11", "00" is written. Thereafter, data in the third page (upper page) of "011" is written in the middle memory cell MCx. In this case, adjacent memory cells are brought into the most easily affected situation while data "011" is written. In this embodiment, however, write is executed at the second sub-stage after affected at the first sub-stage such that adjacent memory cells have thresholds of "111" and "000", thereby providing correct threshold distributions with influences canceled.

Figure 14A:
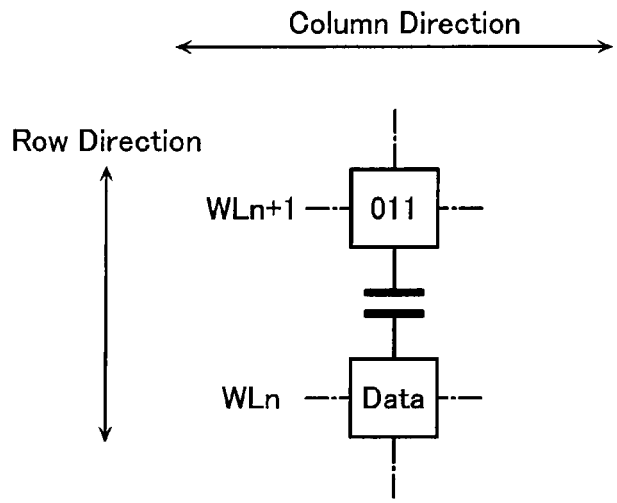
FIGS. 14A and 14B provide diagrams showing the memory cell arrangement in the memory system according to the same embodiment and write data.
Figure 14B:
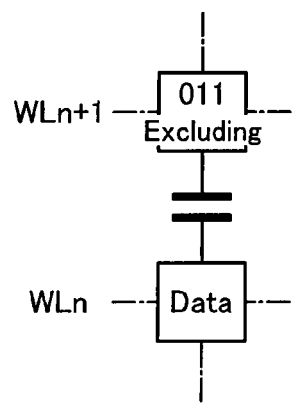

A method of compensating memory cells adjoining in the row direction for the Yupin effect is described next. As shown in FIG. 14, an inter-adjacent-cell capacity C is also present between memory cells MC adjoining in the row direction. Write in the row direction is executed in ascending order of the word line WL number. Therefore, when data "011" is written in a memory cell connected to a word line WLn+1 as shown in FIG. 14A, for example, data stored in a memory cell connected to a word line WLn adjoining in the row direction may be affected from the Yupin effect with higher possibility than when "011" is not written as shown in FIG. 14B.

Therefore, at the time of read from the memory cell connected to the word line WLn, it is tried to read data from the memory cell connected to the next word line WLn+1. In this case, if the data is "011", then the read threshold of the currently read-intended memory cell is set slightly higher.

Figure 15:
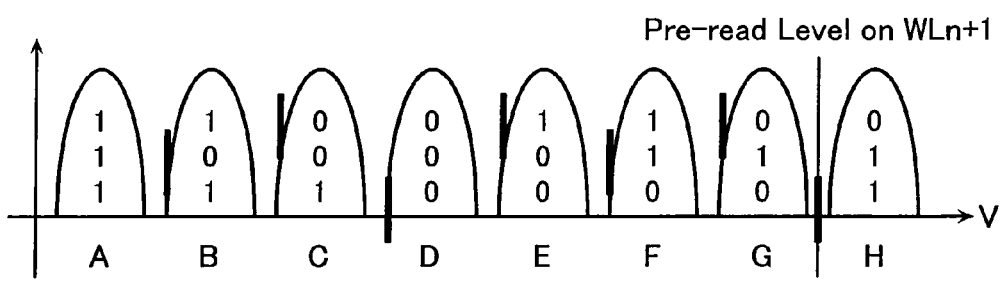
FIG. 15 provides a diagram showing a relation between threshold distributions and read voltages in the memory system according to the same embodiment.

FIG. 15 shows a pre-read voltage on the word line WLn+1 and higher read voltage levels corresponding to threshold distributions with vertical bars. FIG. 16 is a waveform diagram of the pre-read voltage and read voltages for pages. Regular read voltages and slightly higher read voltages are decided and the results are selected in accordance with the contents of data in the next memory cell.

[Other Embodiments]

In the above-described embodiments, plural threshold distributions are written at plural stages corresponding to pages though they may be written at one stage.

The present invention is not limited to the above-described embodiments. For example, in the above embodiments the flash memory used is of the NAND type though memories of other types such as of the NOR type may also be used.

The invention claimed is:

1. A memory system, comprising:
    a nonvolatile semiconductor memory device including
        a memory cell array containing a plurality of memory cells connected to word lines extending in a selection row direction and bit lines extending in a selection column direction, each memory cell having a threshold adjusted to belong to any one of $2^x$ pieces of threshold distributions (x is an integer of 3 or more) to store x-bit data corresponding to said threshold distribution, said memory cells arranged in matrix,
        a word line control circuit connected to said word lines and operative to apply a write voltage, a write-verify voltage or a read voltage to a word line connected to a data write or read target memory cell,
        a sense amplifier circuit connected to said bit lines and operative to read data stored in said memory cell and hold said read data and data to be written in said memory cell, and
        a control circuit operative to generate said write voltage, said write-verify voltage and said read voltage and also generate control signals for control of various parts to control writing and reading data to/from said memory cell; and
    a controller operative to control reading and writing data from/to said nonvolatile semiconductor memory device,
    wherein a writing operation and a verifying operation are repeated at the time of writing to write x-bit data in said memory cell, said writing operation including converting input data provided based on a first bit assignment pattern into a second bit assignment pattern, and applying a write voltage to said word line to shift the threshold of said memory cell based on said second bit assignment pattern, said first bit assignment pattern created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1", said second bit assignment pattern having a suppressed shift of the threshold distribution at the time of writing smaller than said first bit assignment pattern, said verifying operation including applying a write-verify voltage to said word line to verify said threshold,
    wherein a read voltage corresponding to said transition points of "0" and "1" is applied at the time of reading to said word line on a page basis to determine x-bit data stored in said memory cell one-bit by one-bit based on said first assignment pattern, said page containing a set of data on the same digit bit in pieces of x-bit data stored in said memory cells connected to the word line.

2. The memory system according to claim 1, further comprising a data conversion circuit operative to convert said input data provided in accordance with said first bit assignment pattern into said second bit assignment pattern, said data conversion circuit provided in said controller.

3. The memory system according to claim 2, said controller including
    a code word generation circuit operative to generate redundant data for error correction and generate a code word containing external input data and said redundant data added thereto and provide it to said data conversion circuit, and
    an error correction circuit operative to execute error correction of data read out of said nonvolatile semiconductor memory device.

4. The memory system according to claim 1, further comprising a data conversion circuit operative to convert said input data provided in accordance with said first bit assignment pattern into said second bit assignment pattern, said data conversion circuit provided in the front stage of said sense amplifier circuit in said nonvolatile semiconductor memory device.

5. The memory system according to claim 1, wherein said first bit assignment pattern is determined such that a read number in each page comprises a combination of [2,2,3] if X=3.

6. The memory system according to claim 1, wherein said first bit assignment pattern is determined such that a read number in each page comprises a combination of any one of [2,2,3,8], [2,2,4,7], [2,2,5,6], [2,3,3,7], [2,3,4,6], [2,3,5,5], [2,4,4,5], [3,4,4,4,] and [3,3,4,5] if X=4.

7. The memory system according to claim 5, wherein said first bit assignment pattern is a pattern including three patterns shown by [10000111], [11001100] and [11100001] from a lower threshold, which are arbitrarily assigned to a first page through a third page if X=3.

8. The memory system according to claim 1, wherein said second bit assignment pattern contains both "0" and "1" as write data that varies the threshold.

9. The memory system according to claim 1, wherein said control circuit allows writing specific data with the largest threshold shift to be executed earlier than writing other data at the time of writing,
   wherein said control circuit adjusts a read voltage higher than normal at the time of reading if data in an earlier written adjacent memory cell in the bit line direction is said specific data.

10. The memory system according to claim 1, said sense amplifier circuit including
   a first node for use in temporarily storing data and sensing a voltage placed across said bit lines,
   a pair of capacitors having respective one end connected to said first node and for use in temporarily storing data,
   a second node connected from said first node via a first transfer transistor, and
   a third node connected from said first node via a second transfer transistor,
   wherein said second node is a node in a first latch operative to hold read data and write data,
   wherein said third node is a node in a second latch operative to temporarily hold read data or write data.

11. The memory system according to claim 10, said sense amplifier circuit further including
   x pieces of third transfer transistors having respective one end connected to said second node,
   x pieces of fourth nodes provided on the other ends of said x pieces of third transfer transistors and operative to temporarily save and hold write data held on said second node,
   x pieces of first write-back transistors having respective gates connected to said x pieces of fourth nodes and having respective one end supplied with selectively adjusted voltages, and
   x pieces of second write-back transistors having respective one end connected to the other ends of said x pieces of first write-back transistors and having the other ends connected to said first node.

12. A nonvolatile semiconductor memory device, comprising:
   a memory cell array containing a plurality of memory cells connected to word lines extending in a selection row direction and bit lines extending in a selection column direction, each memory cell having a threshold adjusted to belong to any one of $2^x$ pieces of threshold distributions (x is an integer of 3 or more) to store x-bit data corresponding to said threshold distribution, said memory cells arranged in matrix;
   a word line control circuit connected to said word lines and operative to apply a write voltage, a write-verify voltage or a read voltage to a word line connected to a data write or read target memory cell;
   a sense amplifier circuit connected to said bit lines and operative to read data stored in said memory cell and hold said read data and data to be written in said memory cell; and
   a control circuit operative to generate said write voltage, said write-verify voltage and said read voltage and also generate control signals for control of various parts to control writing and reading data to/from said memory cell,
   wherein said control circuit controls such that a writing operation and a verifying operation are repeated at the time of writing to write x-bit data in said memory cell, said writing operation including applying a write voltage to said word line to shift the threshold of said memory cell based on a first bit assignment pattern, said first bit assignment pattern created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1", said verifying operation including applying a write-verify voltage to said word line to verify said threshold,
   wherein said control circuit controls such that a read voltage corresponding to said transition points of "0" and "1" is applied at the time of reading to said word line on a page basis to determine x-bit data stored in said memory cell one-bit by one-bit based on said first assignment pattern, said page containing a set of data on the same digit bit in pieces of x-bit data stored in said memory cells connected to the word line.

13. The nonvolatile semiconductor memory device according to claim 12, further comprising a flag data storage unit operative to store flag data indicating which page is lastly finished to write data,
   wherein said control circuit decides the next write target page with reference to said stored flag data.

14. The nonvolatile semiconductor memory device according to claim 12, wherein said control circuit allows writing specific data with the largest threshold shift to be executed earlier than writing other data at the time of writing,
   wherein said control circuit adjusts a read voltage higher than normal at the time of reading if data in an earlier written adjacent memory cell in the bit line direction is said specific data.

15. The nonvolatile semiconductor memory device according to claim 12, wherein said first bit assignment pattern is determined such that a read number in each page comprises a combination of [2,2,3] if X=3.

16. The nonvolatile semiconductor memory device according to claim 12, wherein said first bit assignment pattern is determined such that a read number in each page comprises a combination of any one of [2,2,3,8], [2,2,4,7], [2,2,5,6], [2,3,3,7], [2,3,4,6], [2,3,5,5], [2,4,4,5], [3,4,4,4,] and [3,3,4,5] if X=4.

17. The nonvolatile semiconductor memory device according to claim 15, wherein said first bit assignment pattern is a pattern including three patterns shown by [10000111], [11001100] and [11100001] from a lower threshold, which are arbitrarily assigned to a first page through a third page if X=3.

18. The nonvolatile semiconductor memory device according to claim 12, wherein said second bit assignment pattern contains both "0" and "1" as write data that varies the threshold.

19. The nonvolatile semiconductor memory device according to claim 12, said sense amplifier circuit including
   a first node for use in temporarily storing data and sensing a voltage placed across said bit lines,
   a pair of capacitors having respective one end connected to said first node and for use in temporarily storing data,
   a second node connected from said first node via a first transfer transistor, and
   a third node connected from said first node via a second transfer transistor,
   wherein said second node is a node in a first latch operative to hold read data and write data, wherein said third node is a node in a second latch operative to temporarily hold read data or write data.

20. A memory system, comprising:
a memory cell array containing first lines, second lines arranged across said first lines, and a plurality of memory cells arranged in matrix along said first and second lines and operative to receive/feed data via said second lines in accordance with a voltage applied to said first lines;
a first line control circuit connected to said first lines and operative to apply a write voltage, a write-verify voltage or a read voltage to a first line connected to a data write or read target memory cell;
a second line control circuit connected to said second lines and operative to read data stored in said memory cell and hold said read data and data to be written in said memory cell; and
a control circuit operative to generate said write voltage, said write-verify voltage and said read voltage and also generate control signals for control of said first and second line control circuits to control writing and reading data to/from said memory cell,
wherein said memory cell has a threshold controlled to belong to any one of $2^x$ pieces of threshold distributions (x is an integer of 3 or more) to store x-bit data,
wherein said control circuit controls such that a writing operation and a verifying operation are repeated at the time of writing to write x-bit data in said memory cell, said writing operation including applying a write voltage to said first line to shift the threshold of said memory cell based on a second bit assignment pattern having a suppressed shift of a threshold distribution at the time of writing smaller than a first bit assignment pattern, said first bit assignment pattern created such that pieces of x-bit data assigned to adjacent threshold distributions have only a one-bit difference therebetween and an alignment of data on the same digit of $2^x$ pieces of x-bit data corresponding to an alignment of $2^x$ pieces of threshold distributions contains at least two transition points of "0" and "1", said verifying operation including applying a write-verify voltage to said first line to verify said threshold,
wherein said control circuit controls such that a read voltage corresponding to said transition points of "0" and "1" is applied at the time of reading to said first line on a page basis to determine x-bit data stored in said memory cell one-bit by one-bit based on said first assignment pattern, said page containing a set of data on the same digit bit in pieces of x-bit data stored in said memory cells connected to the first line.

* * * * *